United States Patent [19]

Vallancourt

[11] Patent Number: 5,661,480

[45] Date of Patent: Aug. 26, 1997

[54] ANALOG-TO-DIGITAL CONVERTERS WITH REDUCED POWER AND AREA USING OFFSET CURRENT COMPENSATION

[75] Inventor: David Gerard Vallancourt, Macungie, Pa.

[73] Assignee: Lucent Technologies Inc., Murray Hill, N.J.

[21] Appl. No.: 529,703

[22] Filed: Sep. 18, 1995

[51] Int. Cl.⁶ .................................................. H03M 1/12
[52] U.S. Cl. ........................ 341/118; 341/127; 341/155; 341/158
[58] Field of Search .................................. 341/146, 127, 341/166, 167, 164, 155

[56] References Cited

U.S. PATENT DOCUMENTS

| | | |
|---|---|---|
| 3,544,993 | 12/1970 | Gabriel . |
| 3,573,802 | 4/1971 | Kawashima et al. . |
| 4,023,160 | 5/1977 | Kirschner .................. 340/347 |
| 4,973,973 | 11/1990 | Abe et al. . |
| 5,019,820 | 5/1991 | Matsuzawa et al. . |
| 5,138,310 | 8/1992 | Hirane et al. . |
| 5,163,760 | 11/1992 | Nardozzi . |
| 5,184,131 | 2/1993 | Ikeda . |
| 5,283,582 | 2/1994 | Krenik ..................... 341/158 |

Primary Examiner—Brian K. Young
Assistant Examiner—Jason H. Vick

[57] ABSTRACT

An integrated circuit is disclosed including an analog-to-digital (A/D) converter having an offset source for providing an offset signal; and a first reference array including a plurality of cells for generating a first output signal from an input signal and the offset signal, for generating a second output signal from the offset signal, and for generating an A/D output signal from the first and second output signals.

23 Claims, 10 Drawing Sheets

FIG. 12

ANALOG-TO-DIGITAL CONVERTERS WITH REDUCED POWER AND AREA USING OFFSET CURRENT COMPENSATION

BACKGROUND OF THE INVENTION

1. Field of the Invention

This disclosure relates to analog-to-digital converters, and more particular to analog-to-digital converters using current offsets for reducing power and area requirements.

2. Description of the Related Art

In current-mode analog-to-digital (A/D) converters, reference arrays having a plurality of circuit components or cells may be used to determine a digital output code or A/D output signal from an input analog current $I_{IN}$ corresponding to input signals. Two techniques may be applied to perform such A/D conversions: bipolar encoding and unipolar encoding.

Figure 1:
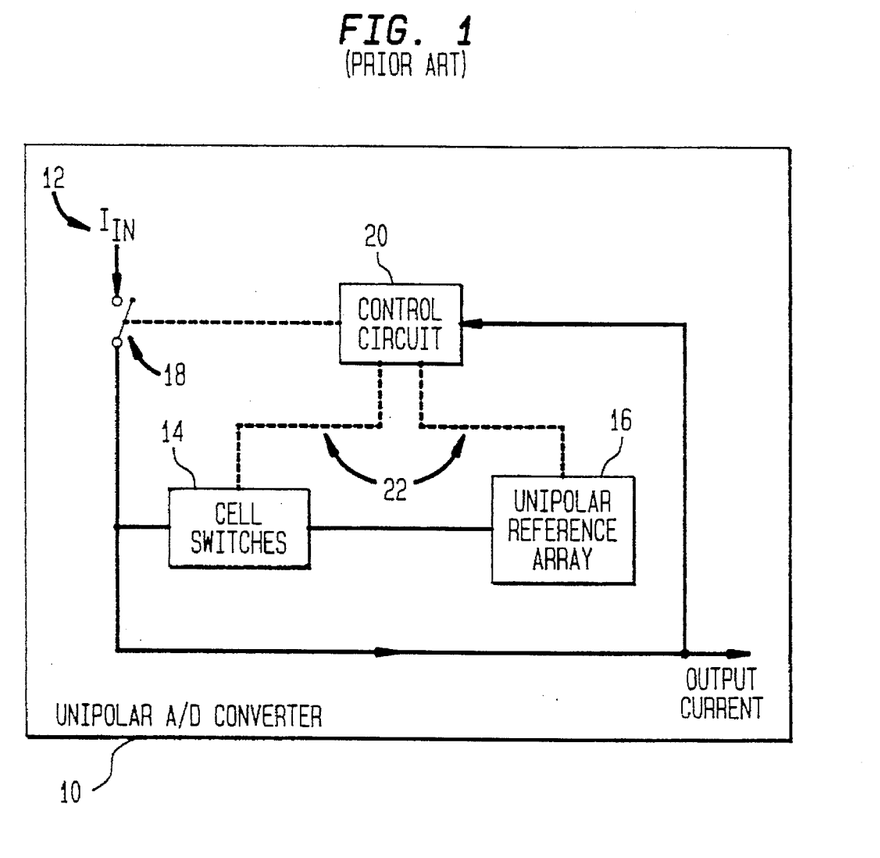
FIG. 1 illustrates a block diagram of a known A/D converter.
Figure 2:
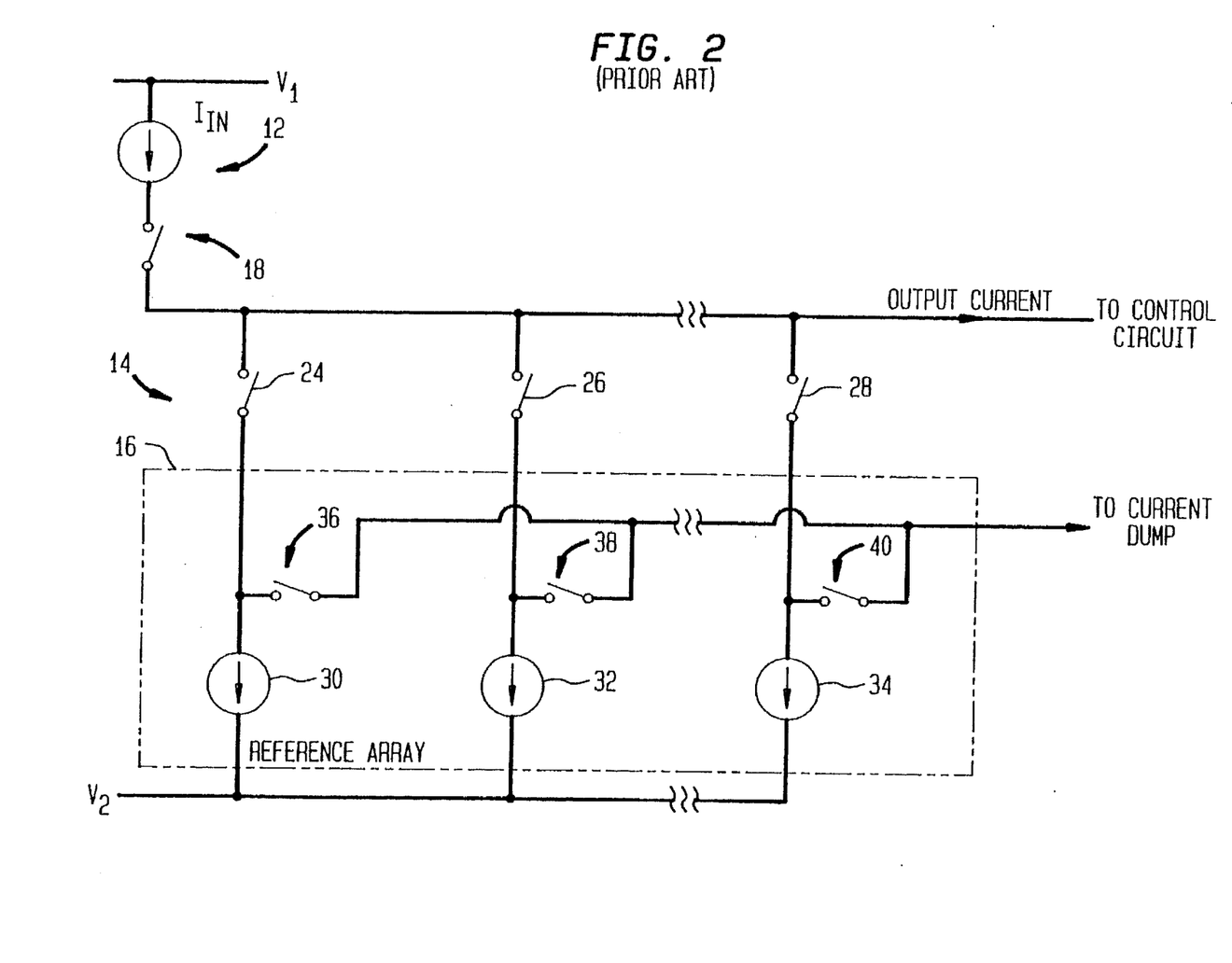
FIG. 2 illustrates a block diagram of FIG. 1 in greater detail.

The current-mode A/D converter 10 shown in FIGS. 1–2 may be used for unipolar coding. Generally, the input current $I_{IN}$ 12 is switched by cell switches 14 to a unipolar reference array 16 which receives the input current 12 through an input switch 18. The conversion process is controlled by a control circuit 20, known in the art, using control lines 22 to each switch in the A/D converter 10. FIG. 2 shows an example circuit configuration of the current-mode A/D converter 10 for unipolar encoding shown in FIG. 1. For convenience of illustration, the control lines 22 from the control circuit 20 to each switch are not shown in FIG. 2.

The input current $I_{IN}$ is provided by the input current source 12, which, for example, may be connected to a first voltage node $V_1$. The cell switches 14 include a plurality of switches 24–28, each respectively associated with one of a set of M cells of the reference array 16. The reference array 16 includes a plurality of current sources 30–34, which may provide substantially equal currents, or which may be weighted. Each of current sources 30–34 is respectively connected to one of the switches 24–28, and each is respectively connected to one of a plurality of current dump switches 36–40 operatively connected to a current dump. In an exemplary embodiment, a first cell includes components 24, 30, 36; a second cell includes components 26, 32, 38; and an $M^{TH}$ includes components 28, 34, 40.

In processing the input current $I_{IN}$, the input current $I_{IN}$ is compared to a sum of the cell currents associated with each cell of the reference array 16. The reference array 16 includes current sources 30–34 operatively connected to a second voltage node $V_2$, which may, for example, be connected to ground. The reference array 16 also includes switches 36–40 connected to respective switches 24–28 and to a current dump (not shown in FIG. 2). In such an architecture, the cell currents are adjusted by the control circuit 20 operating switches 24–28 and 36–40 in a manner known in the art to generate an output current. Each cell is connected to a current dump for receiving the current from each respective cell as a respective one of switches 36–40 closes. The processing by the control circuit 20 is performed until a sum associated with the reference array 16, represented by the output current caused by the open and closed switches, is approximately equal to the input current $I_{IN}$ within the resolution of the A/D converter 10.

A digital output code corresponding to the resulting output current, i.e. the array current value, may be used as the output of the A/D converter 10. In the case where the array cell currents are all equal, the output code may correspond to a count of the number of cells in a predetermined state, such as a "turned on" state.

The accuracy of the above A/D conversion operation may be limited by the accuracy of determination of the array cell currents. For example, a matching of currents in an equally weighted reference array, or the precise ratioing of currents in a non-equally weighted reference array, may be used to determine the integral non-linearity (INL) and differential non-linearity (DNL) of the A/D converter 10. Since a non-equal weighting of array cells may be implemented by grouping cells of an equal-weighted reference array, achieving satisfactory INL and DNL may require the generation of two or more identical reference currents.

In integrated circuit A/D converters fabricated by a process with no post-fabrication trimming, a matching of currents may be obtained for currents of the same polarity. For example, better matching may be possible between the drain currents of two n-channel MOS transistors than between the drain currents of an n-channel MOS and a p-channel MOS device. Accordingly, an input current $I_{IN}$ of a current-mode A/D may be unipolar to attain improved INL and DNL performance, since the input current $I_{IN}$ is to be compared to a unipolar reference array.

Generally, input signals such as voice signals may be zero-mean and/or the processing of such input signals may often be idle. Unipolar encoding may be used, but may require an offset current equal to half the total signal swing, which may, in turn, waste power.

SUMMARY

It is recognized herein that the implementation of bipolar encoding of an input bipolar current using a unipolar reference array may be beneficial in current-mode A/D conversion of such input bipolar currents, since such bipolar encoding involves processing signals which dissipate almost no energy for a substantial portion of the time. The disclosed A/D converter may be implemented on an integrated circuit and includes an offset source for providing an offset signal; and a first reference array including a plurality of cells for generating a first output signal from an input signal and the offset signal, for generating a second output signal from the offset signal, and for generating an A/D output signal from the first and second output signals.

BRIEF DESCRIPTION OF THE DRAWINGS

The features of the disclosed A/D converter and method will become more readily apparent and may be better understood by referring to the following detailed description of an illustrative embodiment of the present invention, taken in conjunction with the accompanying drawings, where.

DESCRIPTION OF THE PREFERRED EMBODIMENTS

Figure 3:
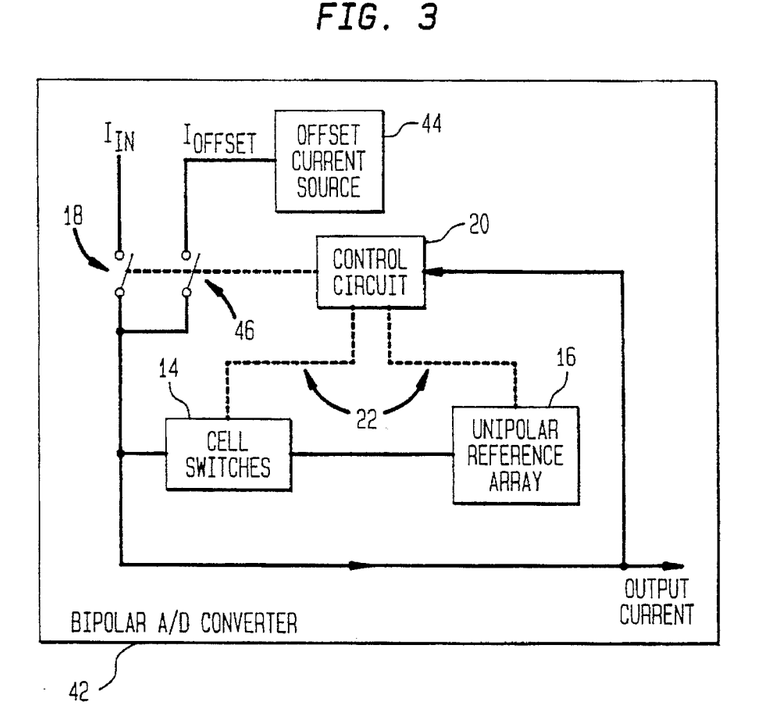
FIG. 3 illustrates a block diagram of a first embodiment of the disclosed A/D converter.

Referring now in specific detail to the drawings, with like reference numerals identifying similar or identical elements, as shown in FIGS. 3–9, the present disclosure describes an exemplary A/D converter and method of operation using current offsets for reducing power and area requirements. FIG. 3 illustrates a block diagram of a first exemplary embodiment 42 of the disclosed A/D converter, which includes an offset current source 44 for providing an offset current $I_{OFFSET}$ through a switch 46 to the cell switches 14. This circuitry is typically incorporated in an integrated circuit (IC), and may be connected to or incorporated with other circuitry of the IC such as a central processing unit (CPU). The control circuit 20 may be incorporated in a control mechanism of the IC including or connected to the disclosed A/D converter 42 in a manner known in the art.

Each of the offset current source 44 and the switch 46 may be implemented, for example, by transistors, with the control circuit 20 controlling the switching of the switch 46 by driving the transistor implementing the switch 46. It is to be understood that any of the current sources and switches disclosed herein may be implemented by transistor circuits or the like, such as logic circuits on an IC implementing the disclosed A/D converter 42.

Figure 4:
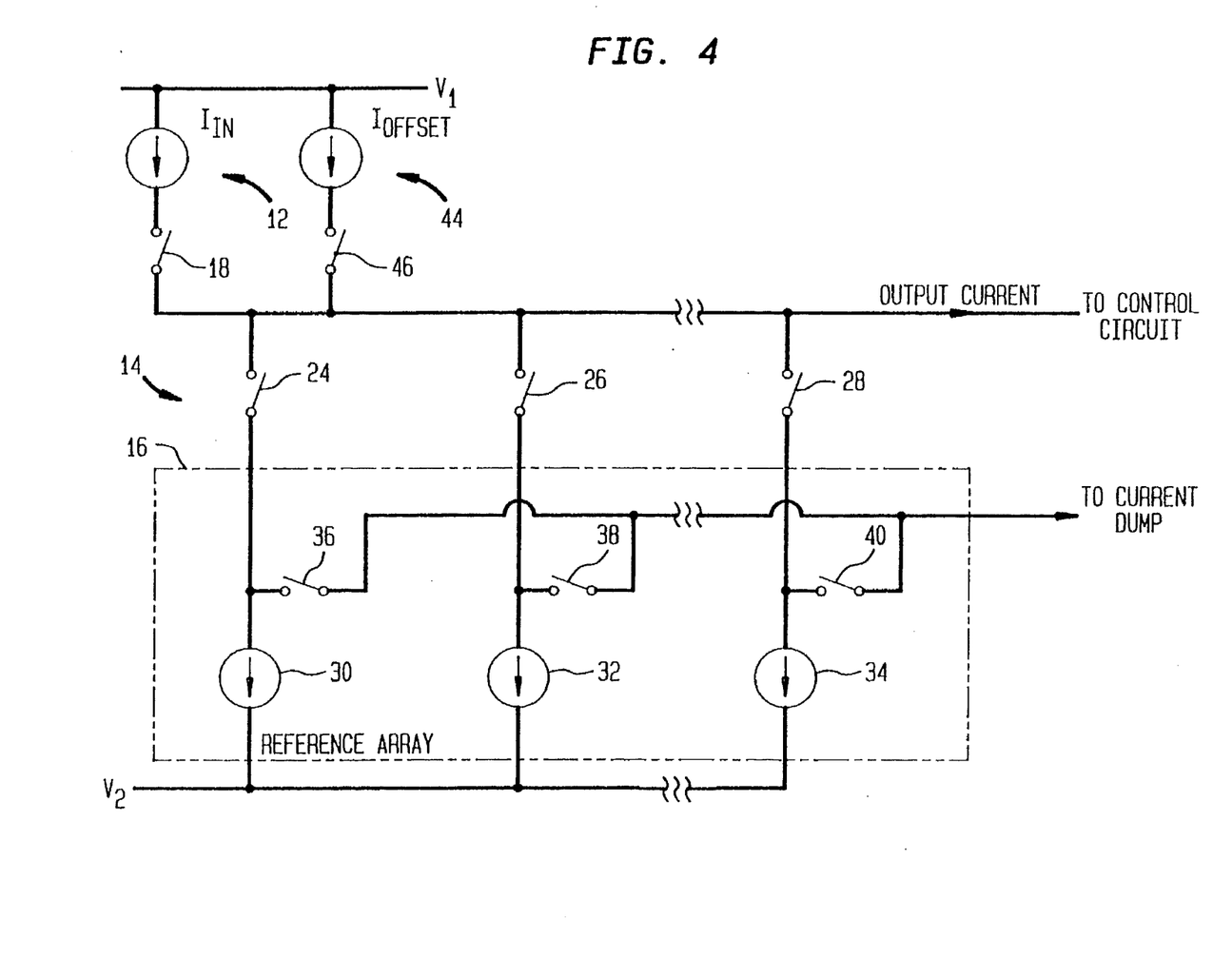
FIG. 4 illustrates a block diagram of FIG. 3 in greater detail.

In an exemplary circuit shown in FIG. 4 as an embodiment of the disclosed A/D converter 42 of FIG. 3, the offset current source 44 and switch 46 may be connected to the cell switches 14 in a parallel configuration with the input current source 12 and switch 18. As described in greater detail below, the offset current source 44 provides a measured half-scale offset current to allow bipolar encoding of the input signal or current $I_{IN}$, while maintaining a unipolar reference using the unipolar reference array 16. For positive input currents $I_{IN}$, the disclosed A/D converter 42 of FIGS. 3–4 operates in a substantially identical manner as the A/D converter 10 of FIGS. 1–2.

In the disclosed A/D converter 42 of FIGS. 3–4, negative input currents are processed by introducing the offset current $I_{OFFSET}$ through a switching of the current source 44 into the circuit, including the cell switches 14 and the reference array 16, with the input current $I_{IN}$ switched into the circuit as well by closing the switch 18. An arbitrary offset current $I_{OFFSET}$ may be used; for example, $I_{OFFSET}$ may be equal to the sum of the currents from the cells of the reference array 16.

Once $I_{OFFSET}$ is switched in, the disclosed A/D converter 42 operates to convert negative input currents in a manner substantially identical to the conversion of positive input currents. For example, reference array cells may be added and/or removed until the difference between the sum of the array currents and the sum of the input current $I_{IN}$ plus offset current $I_{OFFSET}$ is minimized.

A count of the number of array cells active at the end of the conversion procedure may be performed, where the count corresponds to the combination of the input signal $I_{IN}$ and the offset current $I_{OFFSET}$.

Since the value of the offset current may not be well controlled, that is, the offset current may not be made to match the total reference array current due to variability in the manufacturing process and drift of circuit parameters due to aging and temperature, an accurate A/D conversion of the input signal $I_{IN}$ in view of the offset current may be difficult to attain.

In the disclosed A/D converter 42, the output code or A/D output signal corresponding to the input current $I_{IN}$ is accurately determined as disclosed hereinbelow by removing the input current $I_{IN}$ and performing an A/D conversion of the offset current $I_{OFFSET}$ to yield a digital code representing the offset current $I_{OFFSET}$ in terms of the reference array currents. Because the output codes for the offset current $I_{OFFSET}$ and for the combination of the offset current $I_{OFFSET}$ and the input current $I_{IN}$ are generated using the same reference array 16, the output code of the offset current $I_{OFFSET}$ may be subtracted from the output code of the aforesaid combination of currents to produce a final, corrected output code without introducing new sources of error.

For the same total input signal swing, power is saved in the disclosed A/D converter 42 since the total reference array current is reduced by half. The offset current $I_{OFFSET}$ may be measured periodically or at a single instant; for example, at the beginning of the conversion cycle, depending on the duration of the input signal $I_{IN}$ and on the time required for the A/D converter 42 to reach a thermal equilibrium. The impact on converter speed is then negligible, and little extra energy is consumed in measuring the offset current $I_{OFFSET}$.

For implementations on ICs, area may also be saved in view of the use of the offset current source 44, since the offset current source 44 need not be well-controlled, and may thus be of relatively small area and implemented using relatively poorly matched transistors. The area of the offset current source 44 may then be smaller than the area of any reference array current sources which the offset current source 44 may replace.

As shown below, Tables 1–2 summarize exemplary data representing differences in current drawn by the A/D converters in FIGS. 2 and 4, respectively. For Table 1, an input range of $0 \leq I_{IN} \leq M \times I_{CELL}$ is applied to the A/D converter 10 of FIG. 2, where M is an integer representing the number of cells in the reference array 16, and $I_{CELL}$ is the value of the cell current from the respective current sources 30–34. For this example, the average input current value is $M \times I_{CELL}/2$.

TABLE 1

| $I_{IN}$ | TOTAL SUPPLY CUURENT |
|---|---|
| 0 | $M \times I_{CELL}$ |
| $M \times I_{CELL}/2$ | $M \times I_{CELL}$ |
| $M \times I_{CELL}$ | $M \times I_{CELL}$ |

As shown in Table 1, the total supply current is $M \times I_{CELL}$, which is independent of the input current $I_{IN}$.

For Table 2, an input range of $-M \times I_{CELL}/2 \leq I_{IN} \leq M \times I_{cell}/2$ is applied to the A/D converter 42 of FIG. 4, and the average input current value is 0.

TABLE 2

| $I_{IN}$ | TOTAL SUPPLY CUURENT |
|---|---|
| $-M \times I_{CELL}/2$ | $M \times I_{CELL}$ |
| 0 | $M \times I_{CELL}/2$ |
| $M \times I_{CELL}/2$ | $M \times I_{CELL}$ |

As shown in Table 2, the total supply current is $((M \times I_{CELL}/2) + |I_{IN}|)$. Therefore, the tables above show that the average supply current is reduced by half for the implementation in FIG. 3. Accordingly, the supply current varies as $I_{IN}$, which is more desirable over the prior art as it uses less power.

In the above examples in Tables 1–2, all currents in each A/D converter are not shut off; therefore, if a given current from a current source in the reference array 16 is not needed at a given instant in the conversion process, the given current is routed to the current dump. This use of a current dump may be used for high-speed data conversions if insufficient time is available for re-establishing, to a required degree of accuracy, the output current of the current source that is shut off.

Figure 5:
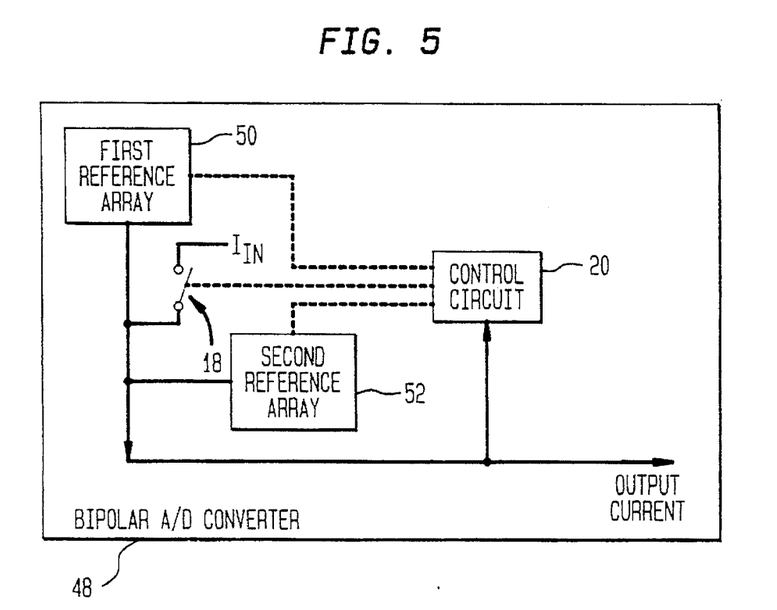
FIG. 5 illustrates a block diagram of a second embodiment of the disclosed A/D converter.
Figure 6:
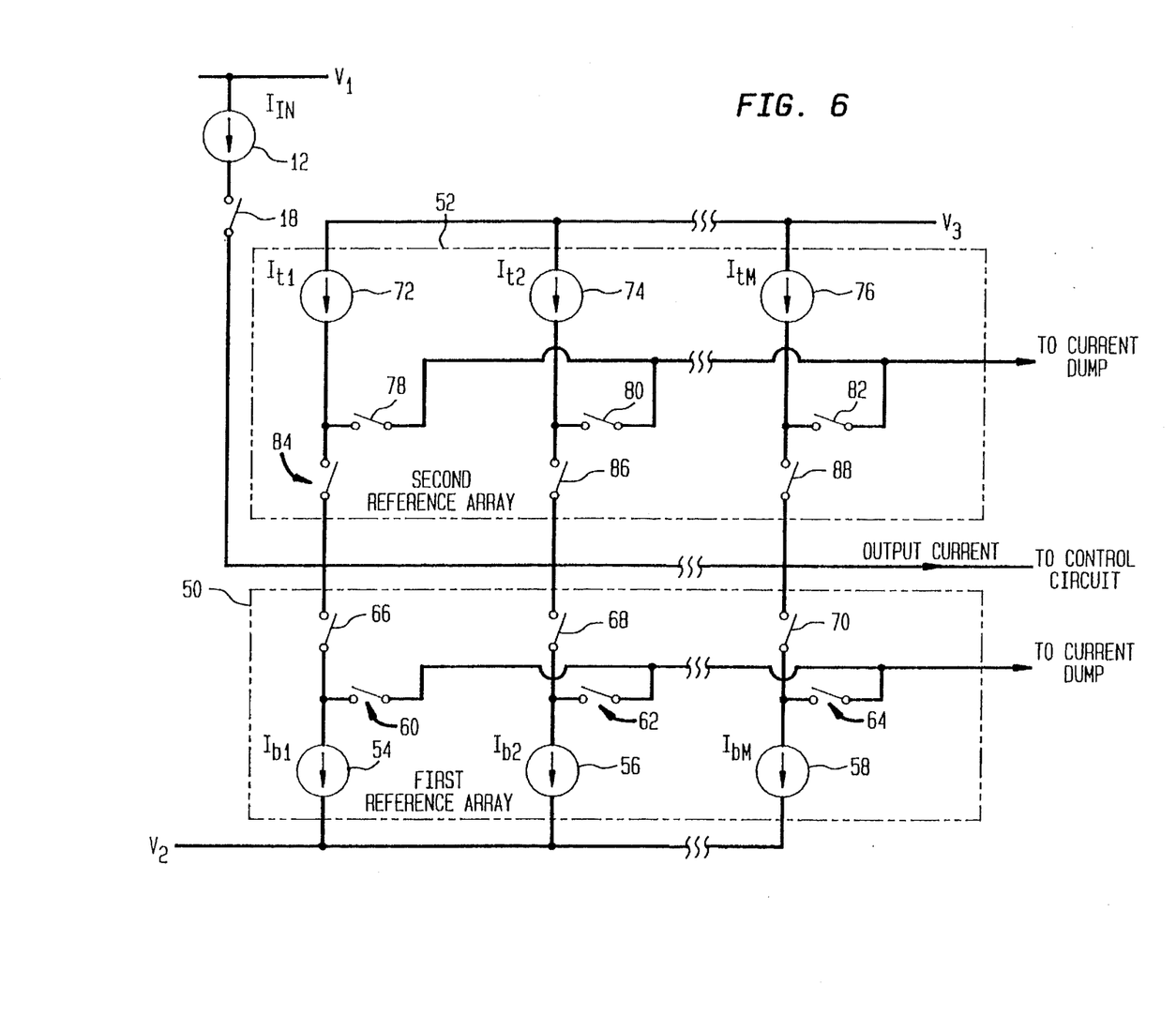
FIG. 6 illustrates a block diagram of FIG. 5 in greater detail.

FIG. 5 illustrates a block diagram of a second embodiment 48 of the disclosed A/D converter including a first reference array 50 and a second reference array 52 for processing the input current $I_{IN}$. FIG. 6 illustrates the second exemplary embodiment 48 of FIG. 5 in greater detail, where the first reference array 50 is connected to a second voltage node $V_2$ and includes a first set of current sources 54–58 for providing current $I_{b1}, I_{b2}, \ldots I_{bM}$, respectively. Each of the current sources 54–58 is connected to a set of switches 60–64, respectively, which are connected to a current dump (not shown in FIG. 6). Each of the current sources 54–58 is also connected to another set of switches 66–70, respectively, for connection to the control circuit 20 shown in FIG. 5.

The second reference array 52 is connected to a third voltage node $V_3$ and includes a second set of current sources 72–76 for providing current $I_{t1}, I_{t2}, \ldots I_{tM}$, respectively. Voltage nodes $V_2, V_3$ may be used to provide operating voltages for the reference arrays 50–52, and in particular, at least one of $V_2, V_3$ may be connected to ground. Each of the current sources 72–76 is connected to a set of switches 78–82, respectively, which are connected to a current dump (not shown in FIG. 6). Each of the currents sources 72–76 is also connected to another set of switches 84–88, respectively, for connection to the control circuit 20 shown in FIG. 5. When sufficient time is available to allow total shutdown of unused or unnecessary currents in the reference arrays 50–52, then additional power may be saved by the disclosed A/D converter shown in FIG. 6. Either of the reference arrays 50, 52 is used to approximate the input current $I_{IN}$, depending on the polarity of the input current.

For the exemplary embodiment in FIGS. 5–6, the first reference array 50 may be used as a reference array for measuring an offset current generated by the second reference array 52 for a negative input current $I_{IN}$. Alternatively, the second reference array 52 may be used as the reference array for measuring an offset current generated by the first reference array 50 for the input current $I_{IN}$. For positive input currents, at least one of the reference arrays 50–52 may be disabled for processing the input current $I_{IN}$ without an offset current, as described above for FIGS. 3–4. The symmetry in implementation and operation of the reference arrays 50–52 provide flexibility in the A/D conversion of bipolar input signals, as well as the advantages in power consumption and area as described above.

The symmetrical configuration of reference arrays 50–52 in FIGS. 5–6 may be implemented where the reference arrays 50–52 are binary-weighted; i.e. the current sources of the reference arrays are binary-weighted. In a typical embodiment, a least significant bit (LSB) for the second reference array 52 is substantially equal in magnitude to the LSB of the first reference array 50 to within 50% accuracy, even with poor matching, so the designed resolution of the A/D converter 48 is provided.

In the embodiment of FIG. 5, when the reference arrays 50–52 are equal-weighted, i.e. the current sources provide substantially equal currents, the cells of the second reference array 52 generally are not measured individually in terms of the cells of the first reference array 50. In alternative embodiments of the disclosed A/D converter 48, such as example embodiments shown in FIGS. 7–8, the outputs of the cells of one reference array may be measured in terms of the cells of another reference array.

Referring to FIG. 6, one alternative embodiment has, for example, the cells of the second reference array 52 matched to each other, and the control circuit 20 measures the sum of these cells in terms of the first reference array 50. The control circuit 20 then determines a common output value to be attributed to each cell of the second reference array 52 as the measured sum divided by the number of cells; for example, M.

Figure 7:
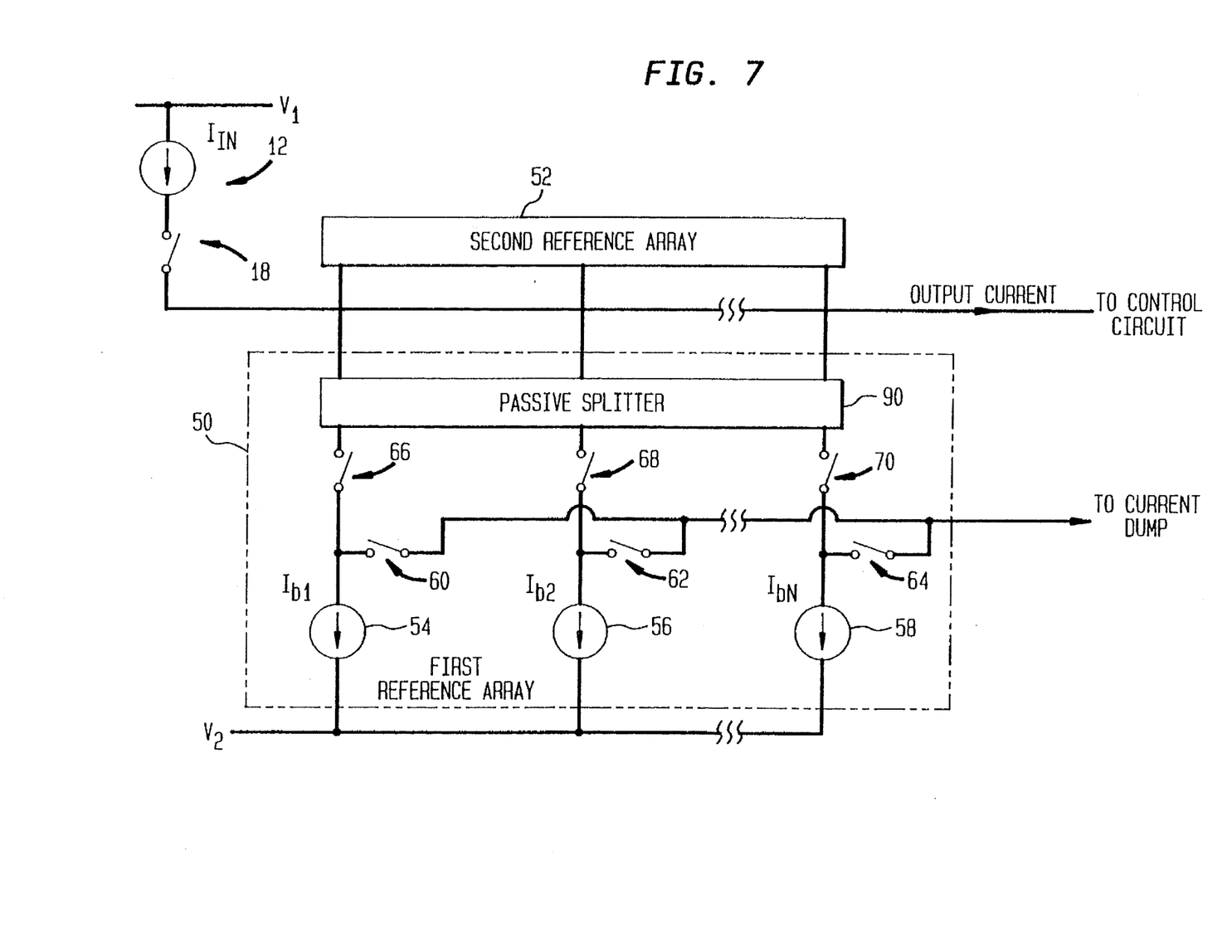
FIG. 7 illustrates a block diagram of an alternative embodiment of the disclosed A/D converter.

In another alternative embodiment, as shown in FIG. 7, the disclosed A/D converter 48 includes a passive current splitter 90, such as a passive splitter known in the art, in series with at least one of the cells of, for example, the first reference array 50. The cell or cells connected to the passive splitter 90 are used to measure the currents of each of the cells of the second reference array 52. In this alternative embodiment, the passive splitter 90 may have about a 50% accuracy.

Figure 8:
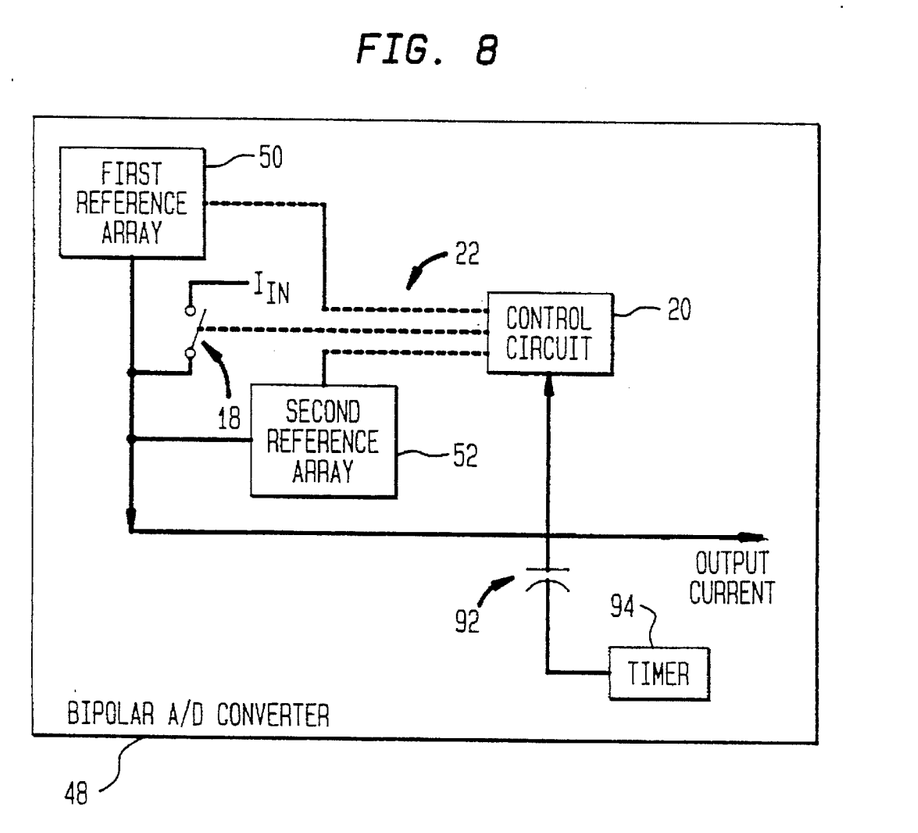
FIG. 8 illustrates a block diagram of another alternative embodiment of the disclosed A/D converter.

In another alternative embodiment, as shown in FIG. 8, the disclosed A/D converter 48 includes a capacitor 92 and a timer 94 for performing timing control to measure directly each cell of, for example, the second reference array 52 in terms of at least one cell, or even each cell, of the first reference array 50. The capacitor 92 may be, for example, a linear capacitor.

Such timing control is performed, for example, by charging the capacitor 92 from an initially discharged state for a predetermined number of clock cycles, counted by the timer 94. The charging is performed, for example, by a current source of a cell from the second reference array 52. In this example, the capacitor 92 is then discharged for an indeterminate or variable number of clock cycles using a source of a cell under test from the first reference array 50 until the capacitor 90 has no charge, or alternatively has been substantially discharged to a predetermined threshold. During the discharge, the timer 94 counts the variable number of clock cycles required to complete the discharge. The ratio of the predetermined number of charging cycles to the variable number of discharge cycles may be used to determine the value of the current from one current source of a cell in terms of the other current source.

Figure 9:
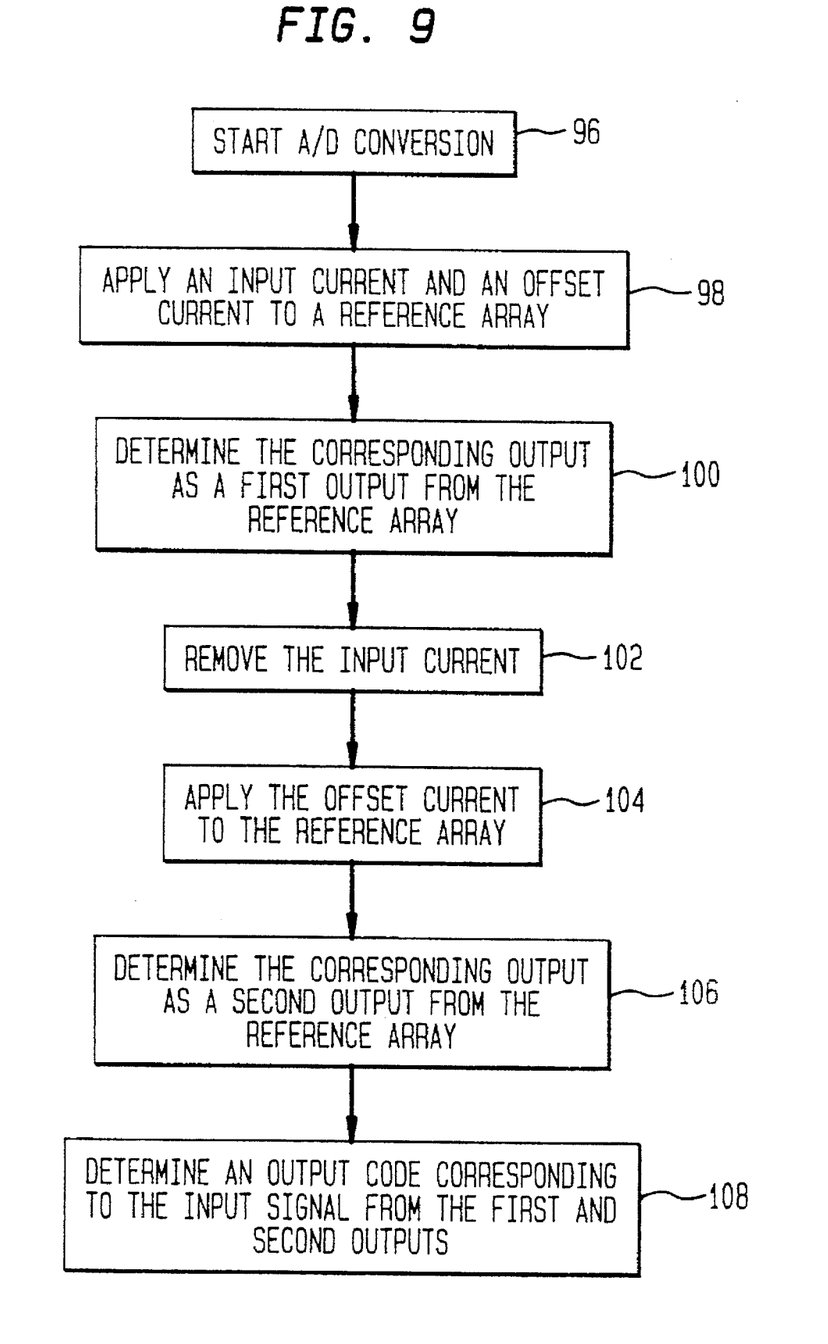
FIG. 9 illustrates a flowchart of the method of operation of the disclosed A/D converter.

FIG. 9 illustrates a flowchart of the method of operation of the disclosed A/D converter 42 shown in FIGS. 3–4, which also may be applied to the disclosed A/D converter 48 shown in FIGS. 5–8. In operation, the disclosed A/D converter 42 starts A/D conversion in step 96; applies an input current $I_{IN}$ and an offset current $I_{OFFSET}$ to a reference array in step 98; determines the output corresponding to the combination of the input current $I_{IN}$ and offset current $I_{OFFSET}$ as a first output from the reference array in step 100; removes the input current $I_{IN}$ in step 102; applies the offset current $I_{OFFSET}$ to the reference array in step 104; determines the corresponding output of the offset current $I_{OFFSET}$ as a second output from the reference array in step 106; and determines an output code or A/D output signal corresponding to the input signal $I_{IN}$ from the first and second outputs in step 108.

Figure 10:
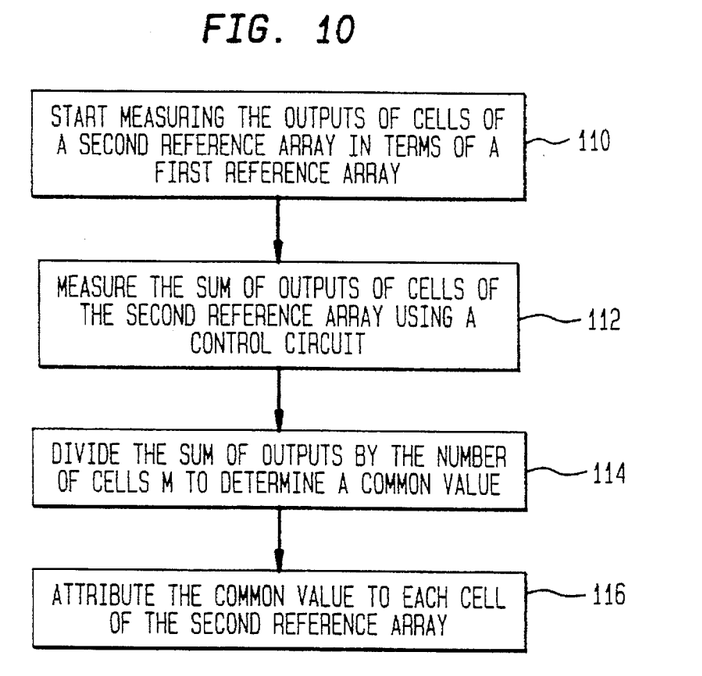
FIGS. 10–12 illustrate flowcharts of methods for determining outputs of cells of the disclosed A/D converter.
Figure 11:
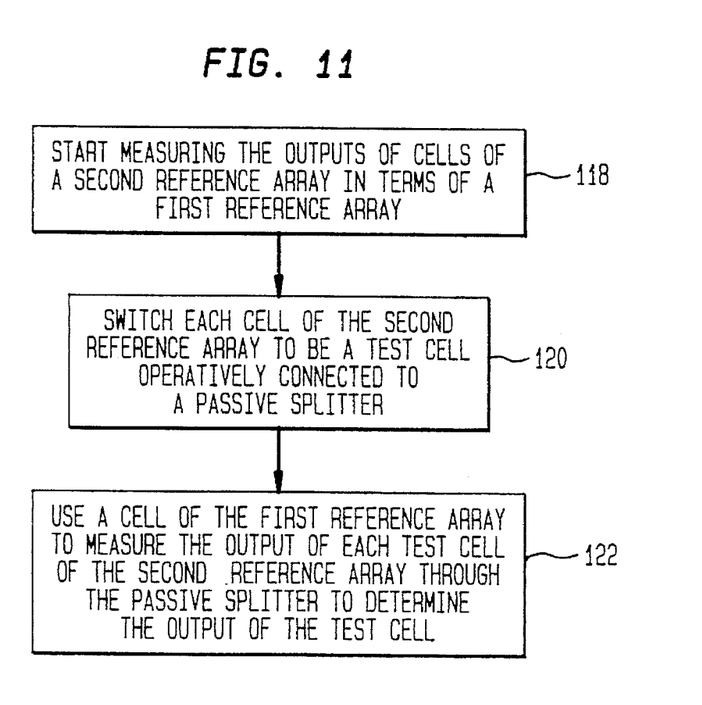
Figure 12:
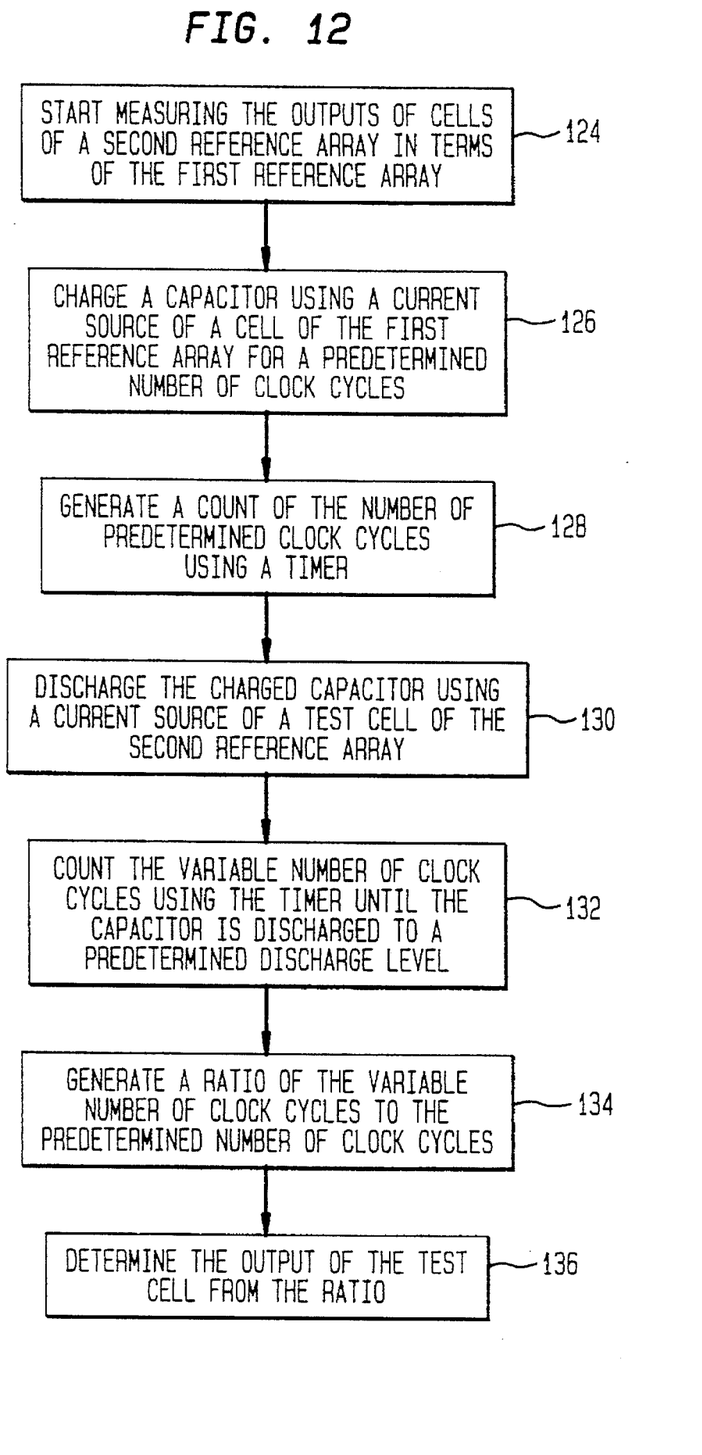

FIGS. 10–12 illustrate flowcharts of methods for determining outputs of cells of the disclosed A/D converter. The method of FIG. 10 is used for the alternative embodiment described above to determine a common output value to be attributed to each cell of a reference array. Referring to FIG. 6 in conjunction with FIG. 10, the method includes the steps of starting to measure the outputs of cells of, for example, a second reference array 52 in terms of the first reference array 50 in step 110; measuring the sum of outputs of cells of the second reference array 52 using the control circuit 20 in step 112; dividing the sum of outputs by the number of cells; i.e. M, in step 114 to determine a common output value; and attributing the common output value to each cell of the second reference array 52 in step 116.

The method of FIG. 11 is used for the alternative embodiment described above to determine an output of each cell of a reference array using the passive splitter 90. Referring to FIG. 7 in conjunction with FIG. 11, the method includes the steps of starting to measure the outputs of cells of, for example, a second reference array 52 in terms of the first reference array 50 in step 118; switching each cell of the second reference array 52 to be a test cell operatively connected to the passive splitter 90 in step 120; and using a cell of the first reference array 50 to measure the output of each test cell of the second reference array 52 through the passive splitter 90 to determine the output of the test cell in step 122.

The method of FIG. 12 is used for the alternative embodiment described above to determine an output value of each cell of a reference array using the capacitor 92 and timer 94. Referring to FIG. 8 in conjunction with FIG. 12, the method includes the steps of starting to measure the outputs of cells of, for example, a second reference array 52 in terms of the first reference array 50 in step 124; charging the capacitor 92 using a current source of a cell of the first reference array 50 in step 126 for a predetermined number of clock cycles; generating a count of the number of predetermined clock cycles using the timer 94 in step 128; discharging the charged capacitor 92 using a current source of a test cell of the second reference array 52 in step 130; counting the variable number of clock cycles using the timer 94 until the capacitor 92 is discharged to a predetermined discharge level in step 132; generating the ratio of the variable number of clock cycles to the predetermined number of clock cycles in step 134; and determining the output of the test cell from the ratio in step 136.

While the disclosed A/D converter and method have been particularly shown and described with reference to the preferred embodiments, it is understood by those skilled in the art that various modifications in form and detail may be made therein without departing from the scope and spirit of the invention. While the switches may be embodied as MOSFETs, such as CMOS, it is understood that bipolar transistors may also be used to implement the switches. It is understood that one having ordinary skill in the art may also use the disclosed A/D converter with other known A/D conversion techniques to control and/or reduce errors associated with A/D converters, digital signal processing (DSP) circuits, and other circuits such as those incorporated in integrated circuits for microprocessors. Accordingly, modifications such as those suggested above, but not limited thereto, are to be considered within the scope of the invention.

What is claimed is:

1. An integrated circuit including an analog-to-digital (A/D) converter comprising:

an offset source for providing an offset signal; and a first reference array including a plurality of cells for generating a first output signal from an input signal and the offset signal during a first cycle wherein the input signal is switched into the first reference array, for generating a second output signal from the offset signal during a second cycle wherein the input signal is switched out of the first reference array, and for generating an A/D output signal from the first and second output signals.

2. The integrated circuit of claim 1 wherein the first reference array has a unipolar configuration and operates, in conjunction with the offset source, for generating the A/D output signal from a bipolar input signal.

3. The integrated circuit of claim 1 further comprising:

a set of cell switches for connecting the offset source with a respective cell of the first reference array.

4. The integrated circuit of claim 1 wherein the first reference array further includes a set of switches for connecting a current dump with a respective current source of a respective cell in the first reference array.

5. The integrated circuit of claim 1 further including:

a first switch for providing to the first reference array input currents corresponding to the input signal;

a second switch for providing to the first reference array an offset current corresponding to the offset signal;

wherein the first reference array, responsive to the first switch being closed and the second switch being open, generates the A/D output signal from a first input current having a first polarity, and responsive to the second switch being closed and the first switch being switched for generating the A/D output signal from a second input current having a second polarity.

6. The integrated circuit of claim 1 further comprising:

a second reference array, including the offset source.

7. The integrated circuit of claim 6 further comprising:

means for dividing a sum of output values from a plurality of cells of the second reference array by the number of cells.

8. The integrated circuit of claim 6 further comprising:

a passive splitter operatively connected to at least one of a plurality of cells of the first reference array.

9. The integrated circuit of claim 6 further comprising:

a capacitor operatively connected to an output node connected to the first and second reference arrays; and a timing control circuit for counting clock cycles during the charging and discharging of the capacitor by at least one of the first and second reference arrays.

10. An analog-to-digital (A/D) converter for converting bipolar input signals to digital output codes comprising:

an offset current source for providing an offset current; and a first reference array having a unipolar configuration and including a plurality of cells, each cell including a current source, for generating a first output signal from an input signal and the offset current during a first cycle, wherein the input signal is switched into the first reference array, for generating a second output signal from the offset current during a second cycle wherein the input signal is switched out of the first reference array, and for generating an A/D output code from the first and second output signals.

11. The A/D converter of claim 10 further comprising:

a set of cell switches for connecting the offset current source with a respective cell of the first reference array.

12. The A/D converter of claim 10 wherein the first reference array further includes a set of switches for connecting a current dump with a respective current source of a respective cell in the first reference array.

13. The A/D converter of claim 10 further including:

a first switch for providing to the first reference array input currents corresponding to the input signal;

a second switch for providing the offset current to the first reference array;

wherein the first reference array, responsive to the first switch being closed and the second switch being open, generates the A/D output code from a first input current having a positive polarity, and responsive to the second switch being closed and the first switch being switched for generating the A/D output signal from a second input current having a negative polarity.

14. The A/D converter of claim 10 further comprising:

a second reference array having a unipolar configuration and including a plurality of cells, each cell including a cell current sources, wherein at least one of the cell current sources operates as the offset current source.

15. The A/D converter of claim 14 further comprising:

a control circuit for dividing a sum of output values from a plurality of cells of the second reference array by the number of cells.

16. The A/D converter of claim 14 further comprising:

a passive splitter operatively connected to at least one of a plurality of cells of the first reference array.

17. The A/D converter of claim 14 further comprising:

a capacitor operatively connected to an output node connected to the first and second reference arrays; and a timing control circuit for counting a predetermined number of clock cycles during the charging of the capacitor by the second reference array, and for counting a variable number of clock cycles during the discharging of the capacitor by the first reference array.

18. A method comprising the steps of:

switching an input signal into a first reference array during a first cycle;

applying the input signal and an offset signal to the first reference array during the first cycle;

determining a first output signal from the first reference array corresponding to the input signal and offset signal during the first cycle;

switching the input signal out of the first reference array to remove the input signal from the first reference array during a second cycle;

determining a second output signal from the reference array corresponding to the offset signal during the second cycle; and determining an analog-to-digital (A/D) signal corresponding to the input signal from the first and second output signals.

19. The method of claim 18 wherein the step of determining the first output signal includes the step of:

connecting a current dump with a respective current source of a respective cell in the first reference array.

20. The method of claim 18 wherein the step of applying the input signal and the offset signal includes the steps of:

closing a first switch for applying the input signal to the first reference array; and closing a second switch for applying the offset signal to the reference array; and the step of removing the input signal includes the step of opening the first switch.

21. The method of claim 18 wherein the step of applying the offset signal to the first reference array includes the step of:

providing the offset signal from a second reference array.

22. The method of claim 21 further comprising the steps of:

counting clock cycles during the charging and discharging of a capacitor by at least one of the first and second reference arrays using a timer; and determining an output of the second reference array relative to the first reference array using the counted clock cycles.

23. The method of claim 21 further comprising the steps of:

determining a sum of outputs of a plurality of cells of the second reference array;

dividing the sum by the number of cells to determining a common value; and attributing the common value to each of the plurality of cells of the second reference array.

* * * * *